United States Patent
Lee et al.

(10) Patent No.: US 10,141,621 B2
(45) Date of Patent: Nov. 27, 2018

(54) HIGH FREQUENCY TRANSMISSION CABLE

(71) Applicant: Bellwether Electronic Corp, Taoyuan (TW)

(72) Inventors: Hsing-Yu Lee, Taoyuan (TW); Jen-Hsu Hu, New Taipei (TW)

(73) Assignee: BELLWETHER ELECTRONIC CORP, Taoyuan (TW)

( * ) Notice: Subject to any disclaimer, the term of this patent is extended or adjusted under 35 U.S.C. 154(b) by 0 days.

(21) Appl. No.: 15/643,609

(22) Filed: Jul. 7, 2017

(65) Prior Publication Data
US 2018/0062234 A1     Mar. 1, 2018

(30) Foreign Application Priority Data
Aug. 29, 2016    (CN) .......................... 2016 1 0754182

(51) Int. Cl.
| | |
|---|---|
| *H01B 7/08* | (2006.01) |
| *H01P 3/02* | (2006.01) |
| *H01B 3/44* | (2006.01) |
| *H01B 7/02* | (2006.01) |
| *H01B 7/04* | (2006.01) |
| *H01B 11/00* | (2006.01) |
| *H05K 9/00* | (2006.01) |
| *H01P 3/06* | (2006.01) |
| *H01B 7/17* | (2006.01) |

(52) U.S. Cl.
CPC .............. *H01P 3/02* (2013.01); *H01B 3/441* (2013.01); *H01B 7/0216* (2013.01); *H01B 7/04* (2013.01); *H01B 7/0823* (2013.01); *H01B 7/0861* (2013.01); *H01B 11/00* (2013.01); *H01P 3/06* (2013.01); *H05K 9/0084* (2013.01); *H01B 7/17* (2013.01)

(58) Field of Classification Search
CPC .......................................................... H01B 7/08
USPC ....................................................... 174/113 R
See application file for complete search history.

(56) References Cited

U.S. PATENT DOCUMENTS

| | | | | |
|---|---|---|---|---|
| 2009/0126972 | A1* | 5/2009 | Matsushita | .......... H01B 7/0861 |
| | | | | 174/113 R |
| 2011/0028017 | A1* | 2/2011 | Chuo | .................. H05K 1/0218 |
| | | | | 439/329 |
| 2012/0292085 | A1* | 11/2012 | Watanabe | .............. H05K 1/024 |
| | | | | 174/254 |

(Continued)

FOREIGN PATENT DOCUMENTS

JP       2015-036546      *   2/2015          H05K 3/12

*Primary Examiner* — Hoa C Nguyen
*Assistant Examiner* — Stanley Tso
(74) *Attorney, Agent, or Firm* — Li & Cai Intellectual Property (USA) Office

(57) ABSTRACT

The present invention provides a high frequency transmission cable which includes at least one conductor, an insulating layer, a polyolefin resin layer, and a shielding layer. The at least one conductor is covered with the insulating layer. The polyolefin resin layer is coated on an external surface of the insulating layer by a low-k dielectric adhesive layer, and the shielding layer is coated on an external surface of the polyolefin resin layer by another low-k dielectric adhesive layer, wherein the low-k dielectric adhesive layers have a dielectric constant (Dk) less than 3 and a dissipation factor (Df) less than 0.01. Whereby, the high frequency transmission cable can provide high frequency data transmission quality, and can meet the requirement of miniaturization.

9 Claims, 4 Drawing Sheets

(56) References Cited

U.S. PATENT DOCUMENTS

| | | | |
|---|---|---|---|
| 2014/0014409 A1* | 1/2014 | Lin | H02G 15/08 |
| | | | 174/75 R |
| 2016/0087250 A1* | 3/2016 | Gu | H01M 2/0277 |
| | | | 429/176 |
| 2016/0107376 A1* | 4/2016 | Nakajima | B29C 66/742 |
| | | | 428/216 |
| 2016/0247604 A1* | 8/2016 | Chiou | H01B 7/0838 |
| 2017/0259544 A1* | 9/2017 | Okimura | B32B 27/38 |
| 2017/0273192 A1* | 9/2017 | Sato | H05K 3/1291 |

\* cited by examiner

HIGH FREQUENCY TRANSMISSION CABLE

BACKGROUND OF THE INVENTION

1. Field of the Invention

The instant disclosure relates to a cable structure, and more particularly to a flexible flat high frequency transmission cable.

2. Description of Related Art

Nowadays miniaturizing consumer electronics products such as tablet computers and smartphones has gradually become a major development trend. Flexible Flat Cable (FFC), with the advantages of high flexibility, smaller size and thickness, mechanically simple connection, etc., is widely used in consumer electronics products. The FFC includes a plurality of flat conductors, an insulation layer laminated over the conductors, and a shielding layer over the insulation layer, wherein two adjacent layers are bonded together by means of an intervening adhesive layer.

Recently, the FFC has been used as a high speed transmission component for liquid crystal display (LCD) devices, plasma display devices, etc. The FFC may support high speed transmission at a relatively high bandwidth. Specifically, data transmission speed can be varied according to electrical properties of the FFC. One skilled in the art would know that there are many ways to increase data transmission speed, including reducing the diameter of the conductors and disposing a low-k dielectric layer with an increased thickness between the conductors and the shielding layer.

However, the FFC in which conductors each have a desired diameter complies with a predetermined cable specification, so that it is infeasible to reduce the diameter of the conductors. In addition, an increase in the thickness of an insulation layer will result in an increase in cost. Thus, the only possible way is to dispose the low-k dielectric layer, but it is unfavorable for miniaturization and cost down.

SUMMARY OF THE INVENTION

One aspect of the instant disclosure relates to a provide a high frequency transmission cable with high transmission quality and stability of high frequency signals, which can meet the miniaturization requirement of electronic products.

According to one of the embodiments of the instant disclosure, the high frequency transmission cable includes at least one conductor, an insulation layer, a polyolefin resin layer, and a shielding layer. The insulation layer is laminated over the at least one conductor. The polyolefin resin layer is attached to the insulation layer by a first low-k dielectric adhesive layer, and the shielding layer is attached to the polyolefin resin layer by another first low-k dielectric adhesive layer. The polyolefin resin layer has a thickness less than 100 μm. The first low-k dielectric adhesive layers each have a dielectric constant (Dk) less than 3 and a dissipation factor (Df) less than 0.01.

In one embodiment, the polyolefin resin layer is a PE layer.

In one embodiment, the insulation layer includes a second low-k dielectric adhesive layer and two PET layers attached to two opposite surfaces of the second low-k dielectric adhesive layer, and the at least one conductor is encompassed by the second low-k dielectric adhesive layer and is between the PET layers.

In one embodiment, the second low-k dielectric adhesive layer has a dielectric constant (Dk) less than 3 and a dissipation factor (Df) less than 0.01.

In one embodiment, the first low-k dielectric adhesive layers each have a thickness between 5 μm and 20 μm, the second low-k dielectric adhesive layer has a thickness between 5 μm and 100 μm, and the PET layers each have a thickness between 10 μm and 60 μm.

In one embodiment, the shielding layer has a thickness between 5 μm and 25 μm.

In one embodiment, the high frequency transmission cable further includes a protective layer attached to the shielding layer by an adhesive layer.

In one embodiment, the high frequency transmission cable is configured for use in a frequency less than 20 GHZ.

In one embodiment, the high frequency transmission cable further includes two protective layers over two exterior surfaces of the shielding layer respectively.

In one embodiment, the protective layer has a thickness between 5 μm and 200 μm.

Based on the above, the high frequency transmission cable utilizes first low-k dielectric adhesive layers in its construction which has a dielectric constant (Dk) less than 3 and a dissipation factor (Df) less than 0.01. Therefore, compared to the conventional FFC in which the low-k dielectric layer must have a thickness greater than 100 μm to achieve a desired characteristic impedance, the thickness of the polyolefin resin layer of the present invention can be reduced to less than 100 μm, so that the high frequency transmission cable can be miniaturized.

To further understand the techniques, means and effects of the instant disclosure, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DETAILED DESCRIPTION OF THE PREFERRED EMBODIMENTS

Figure 1:
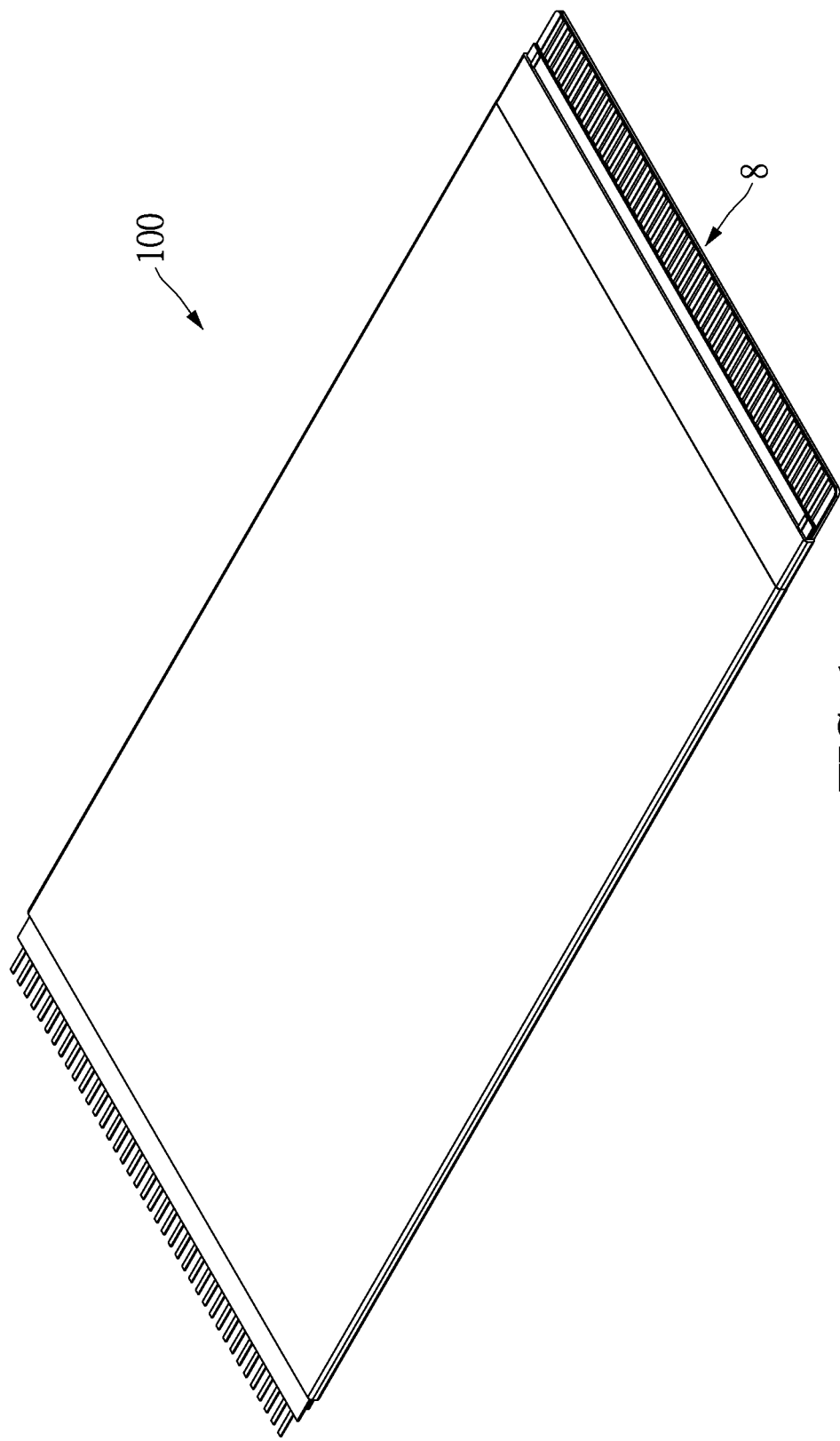
FIG. 1 is a three-dimensional view of a high frequency transmission cable according to the instant disclosure.

Reference will now be made in detail to the exemplary embodiments of the present disclosure, examples of which are illustrated in the accompanying drawings. Wherever possible, the same reference numbers are used in the drawings and the description to refer to the same or like parts.

Notably, the terms first, second, third, etc., may be used herein to describe various elements or signals, but these elements or signals should not be affected by such elements or terms. Such terminology is used to distinguish one element from another or a signal with another signal. Further, the term "or" as used herein in the case may include any one or combinations of the associated listed items.

Referring to FIGS. 1 to 4, the instant disclosure provides a high frequency transmission cable 100 which includes at least one conductor 1, an insulation layer 2, two polyolefin resin layers 3 (i.e., low-k dielectric layer), and two shielding layers 4. The insulation layer 2 is laminated over the at least one conductor 1. The two polyolefin resin layers 3 are respectively attached to upper and lower surfaces of the insulation layer 2. The two shielding layers 4 are respectively attached to two exterior surfaces of the two polyolefin resin layer 3.

Figure 2:
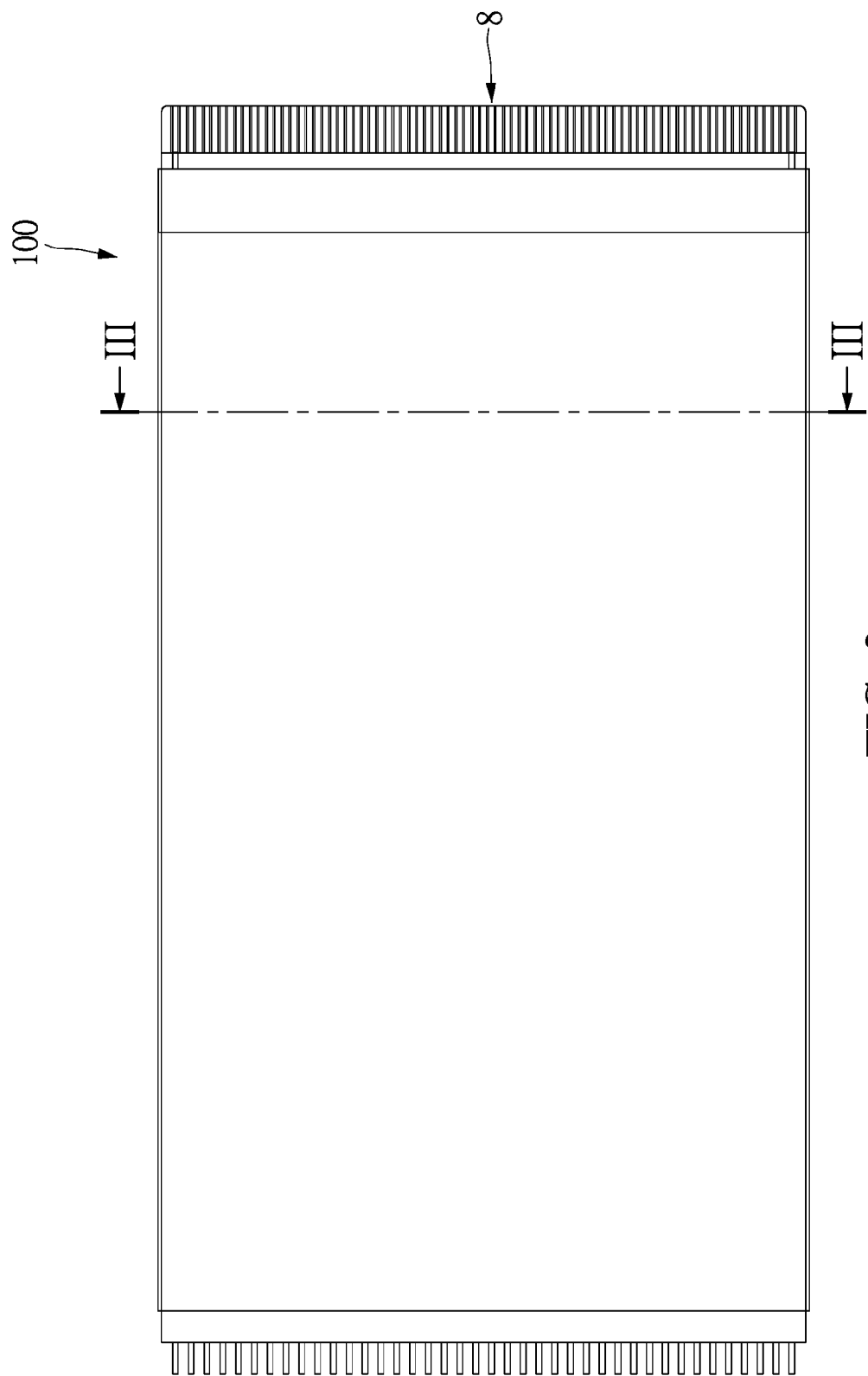
FIG. 2 is a top view of the high frequency transmission cable.

Referring to FIGS. 1 and 2, in the usage state, the high frequency transmission cable 100 can be electrically connected to an electronic device (not shown) by using its terminal end 8 to contact with a connector of the electronic device. The terminal end 8 may be varied according to practical needs, and thus a detailed description thereof is omitted herein for the sake of brevity.

Figure 3:
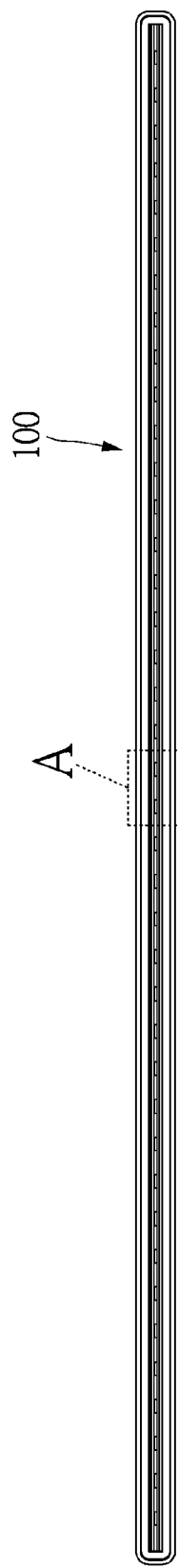
FIG. 3 is a cross-sectional view taken along the section line III-III of FIG. 2.
Figure 4:
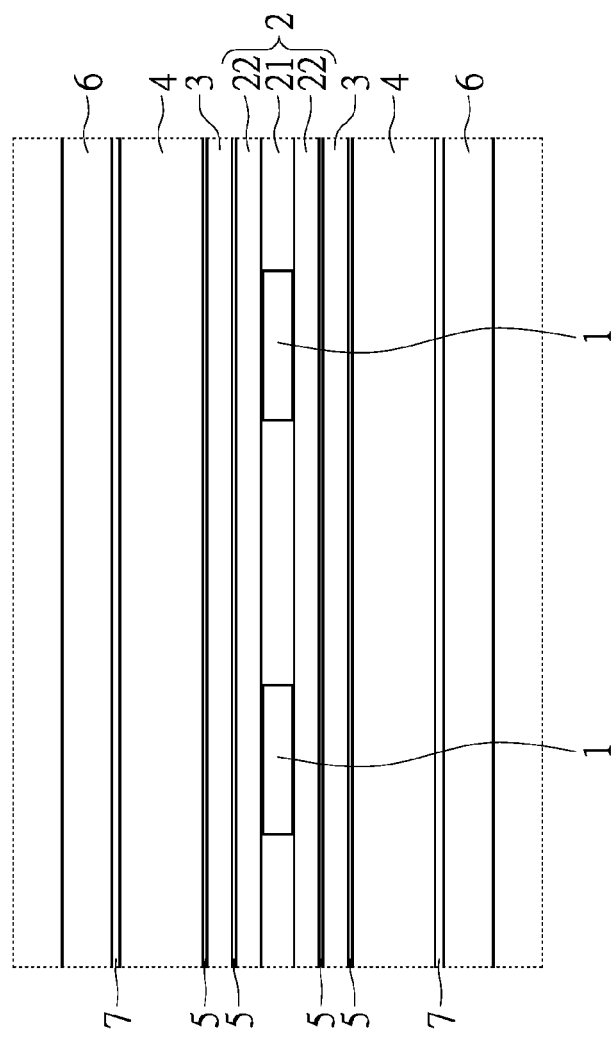
FIG. 4 is an enlarged view taken on part A of FIG. 3.

Referring to FIGS. 3 and 4, each of the polyolefin resin layers 3 and the insulation layer 2 are fixedly connected to each other by a first low-k dielectric adhesive layer 5, and each of the shielding layers 4 and the corresponding polyolefin resin layer 3 are fixedly connected to each other by another first low-k dielectric adhesive layer 5. The first low-k dielectric adhesive layers 5 have a dielectric constant (Dk) less than 3, preferably between 1 and 3, and a dissipation factor (Df) less than 0.01 preferably between 0.00001 and 0.01. The first low-k dielectric adhesive layers 5 each have a thickness between 5 µm and 20 µm.

It should be noted that the first low-k dielectric adhesive layers 5 have low dielectric loss in a high frequency region so that their thickness can be reduced, and thus the high frequency transmission cable 100 can have the advantages of small size and low cost. Particularly, the remarkable miniaturization of the polyolefin resin layers 3 can be performed when they are made of polyethylene (PE). Compared to the conventional FFC in which the low-k dielectric layer must have a thickness greater than 100 µm to achieve a desired characteristic impedance, the thickness of the polyolefin resin layers 3 of the present invention can be reduced to less than 100 µm.

Referring to FIGS. 3 and 4, the following will further describe the required elements of the high frequency transmission cable 100. In practice, the high frequency transmission cable 100 includes a plurality of conductors 1, each of which has a stripe shape and is made of metal foil such as copper foil or tinned copper foil. Please note that the width and thickness of the conductors 1 may be varied according to cable specifications. In view of flexibility of the high frequency transmission cable 100, the thickness of the conductors 1 preferably ranges from 20 µm to 50 µm.

The insulation layer 2 includes a second low-k dielectric adhesive layer 21 and two PET layers 22 attached to two opposite surfaces (i.e., upper and lower surfaces) of the second low-k dielectric adhesive layer 21. The conductors 1, spaced apart from each other, are encompassed by the second low-k dielectric adhesive layer 21 and is between the PET layers 22. In view of electrical and mechanical properties and cost, the second low-k dielectric adhesive layer 21 has a thickness between 5 µm and 100 µm and each of the PET layers 22 has a thickness between 10 µm and 60 µm. To further reduce the thickness of the polyolefin resin layers 3, the second low-k dielectric adhesive layer 21 also has a dielectric constant (Dk) less than 3, preferably between 1 and 3, and a dissipation factor (Df) less than 0.01 preferably between 0.00001 and 0.01. That is to say, the only difference between the first and second low-k dielectric adhesive layers 5, 21 is their thickness.

Furthermore, the first and second low-k dielectric adhesive layers 5, 21 can be made of a pressure-sensitive low-k dielectric adhesive composition which includes (A) from 100 to 120 parts by weight of a vinyl compound or polymer, (B) from 8 to 75 parts by weight of a copolymer of styrene, butadiene and divinylbenzene, (C) from 30 to 110 parts by weight of a flame retardant, and (D) from 0.1 to 10 parts by weight of a peroxide. There are no specific restrictions for the components (A) to (D). In practice, the component (A) can be selected from one or any combination of vinylpolyphenylene ether, maleimide, divinylbenzene, divinylbenzylether, triallyl isocyanurate, diallyl bisphenol A, and maleimide prepolymer. The component (C) can be selected from one or any combination of phosphorus containing, nitrogen containing and halogen containing flame retardants. The component (D) can be selected from dicumyl peroxide and any organic peroxide containing tert-butyl group.

The first and second low-k dielectric adhesive layers 5, 21 can be made of another pressure-sensitive low-k dielectric adhesive composition which includes (A) from 115 to 135 parts by weight of a polyester resin or its elastomer, (B) from 15 to 60 parts by weight of a copolymer of styrene, butadiene and maleic anhydride, (C) from 30 to 110 parts by weight of a flame retardant, and (D) from 0.1 to 10 parts by weight of a peroxide. There are no specific restrictions for the components (A) to (D). In practice, the component (A) can be selected from polyethylene terephthalate (PET), polybutylene terephthalate (PBT), and the combination thereof. The component (C) can be selected from one or any combination of phosphorus containing, nitrogen containing and halogen containing flame retardants. The component (D) can be selected from dicumyl peroxide and any organic peroxide containing tert-butyl group.

The first and second low-k dielectric adhesive layers 5, 21 can be made of still another pressure-sensitive low-k dielectric adhesive composition which includes (A) from 135 to 150 parts by weight of a polyamide resin or its elastomer, (B) from 10 to 50 parts by weight of a vinyl functional polybutadiene urethane oligomer, (C) from 30 to 110 parts by weight of a flame retardant, and (D) from 0.1 to 10 parts by weight of a peroxide. There are no specific restrictions for the components (A) to (D). In practice, the component (A) can be nylon. The component (C) can be selected from one or any combination of phosphorus containing, nitrogen containing and halogen containing flame retardants. The component (D) can be selected from dicumyl peroxide and any organic peroxide containing tert-butyl group.

Please note that said pressure-sensitive low-k dielectric adhesive composition may further include at least one additive selected from the group consisting of hardening accelerators, solvents, crosslinking agents, coupling agents, surfactants, tougheners, and any combination thereof. The aforementioned additives may be commercially available from sources known by those of ordinary skill in the art, or obtained according to conventional methods well known in the art. Unless otherwise defined or specified, all technical and scientific terms used herein have the same meanings known by those skilled in the art. In addition, any process or material similar or equivalent to those cited herein may be used in said pressure-sensitive low-k dielectric adhesive composition.

The polyolefin resin layers 3 have the properties of low dielectric loss, high flexibility and good processability. Each of the polyolefin resin layers 3 can be made of polyethylene (PE), acid-modified polyethylene, polypropylene (PP), acid-modified polypropylene, ethylene-vinyl acetate (EVA), ethylene-methacrylic acid methyl random copolymer (EMMA), ethylene-ethyl acrylate (EEA), ethylene-methacrylic acid copolymer (EMAA), polyionic polymer, or any combination thereof. Please note that each of the polyolefin resin layer 3 can be provided with a flame retardant to improve flame resistance, wherein the content of the flame retardant amounts to from 30 to 80 parts by weights per 100 parts by weight of the corresponding polyolefin resin layer 3. The flame retardant can be selected from one or any combination of inorganic flame retardants, phosphorus containing, nitrogen containing and halogen containing flame retardants, and metal powders.

The shielding layers 4 are configured to reduce electromagnetic interference and noise. Each of the shielding layers 4 can be a metal layer made of copper, aluminum, silver, or the alloy thereof. In view of availability and cost, each of the shielding layers 4 has a thickness between 5 μm and 25 μm.

To increase overall safety, the high frequency transmission cable 100 can further includes two protective layers 6 over two exterior surfaces of the shielding layers 4 respectively. Specifically, each of the protective layers 6 and the corresponding polyolefin resin layer 3 are fixedly connected to each other by an adhesive layer 7 formed by any pressure-sensitive adhesive composition known by those of ordinary skill in the art. Each of the protective layers 6 can be made of thermoplastic or thermosetting insulation material. Specific examples of the thermoplastic insulation material include but are not limited to PE, PVC, LDPE, HDPE, PP, PU, nylon, and teflon. Specific examples of the thermosetting insulation material include but are not limited to SBR, NBR, EPR, EPT, and silicon rubber. In view of availability and cost, each of the protective layers 6 has a thickness between 5 μm and 200 μm.

Figure 5:
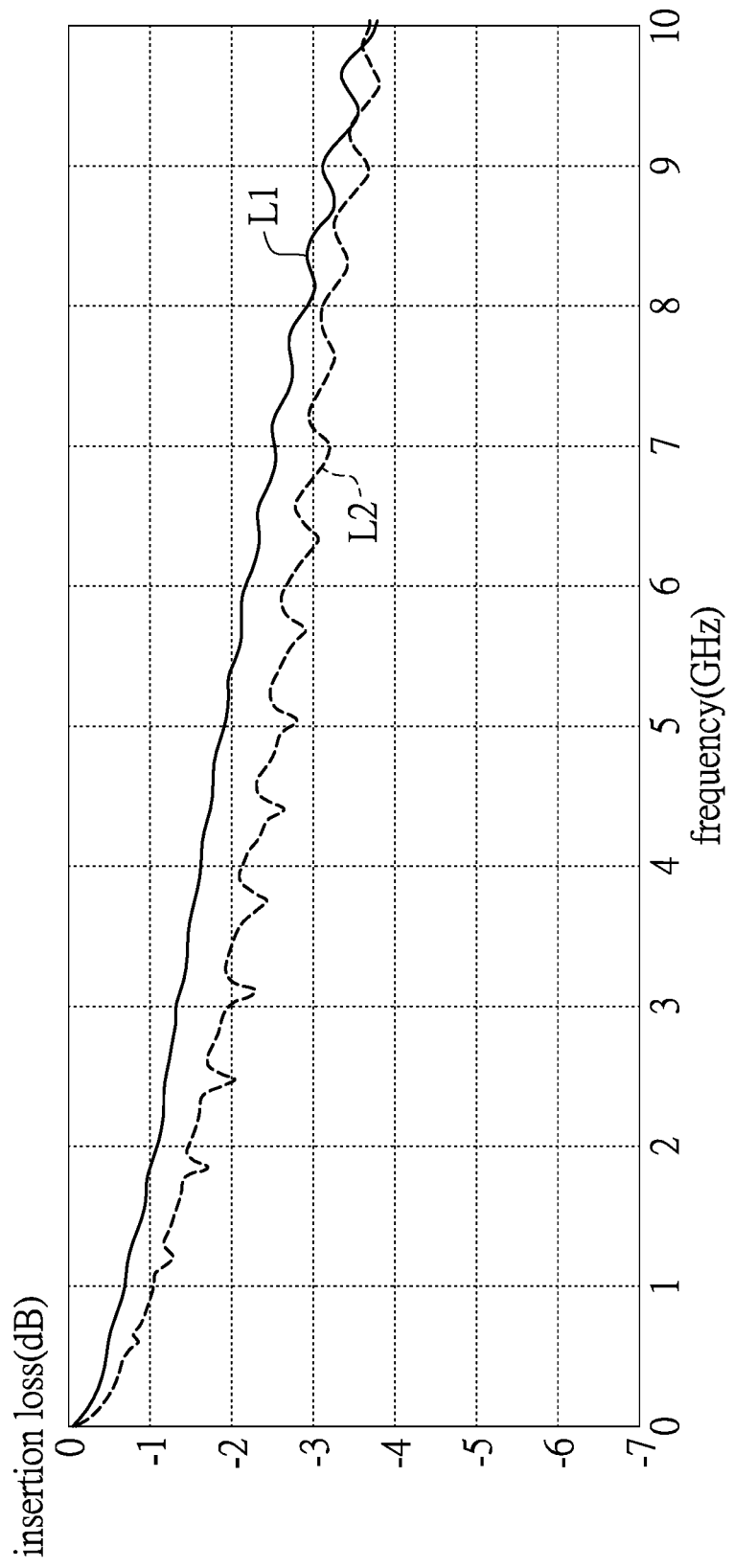
FIG. 5 is a graph showing the functional relationship between insertion loss and frequency.

Referring to FIG. 5, a graph showing the functional relationship between insertion loss and frequency is shown. The high frequency transmission cable 100 (as indicated by the solid line L1), compared to the conventional coaxial cable (as indicated by the dotted line L2), not only can be used in a high frequency region, but also can achieve a relatively high frequency response under the same insertion loss.

By virtue of the above design, the high frequency transmission cable utilizes first low-k dielectric adhesive layers in its construction which has a dielectric constant (Dk) less than 3 and a dissipation factor (Df) less than 0.01. Therefore, compared to the conventional FFC in which the low-k dielectric layer must have a thickness greater than 100 μm to achieve a desired characteristic impedance, the thickness of the polyolefin resin layer of the present invention can be reduced to less than 100 μm, so that the high frequency transmission cable can be miniaturized.

Based on the above, the high frequency transmission cable has higher cost efficiency than the conventional FFC. Furthermore, the high frequency transmission cable can meet the product requirements. For example, it can reduce the thickness and size and use in a high frequency region (i.e., more than 20 GHZ).

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. A high frequency transmission cable, comprising:
   at least one conductor;
   an insulation layer laminated over the at least one conductor;
   a polyolefin resin layer attached to the insulation layer by a first low-k dielectric adhesive layer; and
   a shielding layer attached to the polyolefin resin layer by another first low-k dielectric adhesive layer;
   wherein the polyolefin resin layer has a thickness less than 100 μm, and the first low-k dielectric adhesive layers each have a dielectric constant (Dk) less than 3 and a dissipation factor (Df) less than 0.01; and
   wherein the insulation layer includes a second low-k dielectric adhesive layer and two PET layers attached to two opposite surfaces of the second low-k dielectric adhesive layer, and the at least one conductor is encompassed by the second low-k dielectric adhesive layer and is between the PET layers.

2. The high frequency transmission cable of claim 1, wherein the polyolefin resin layer is a PE layer.

3. The high frequency transmission cable of claim 1, wherein the second low-k dielectric adhesive layer has a dielectric constant (Dk) less than 3 and a dissipation factor (Df) less than 0.01.

4. The high frequency transmission cable of claim 1, wherein the first low-k dielectric adhesive layers each have a thickness between 5 μm and 20 μm, and wherein the second low-k dielectric adhesive layer has a thickness between 5 μm and 100 μm and the PET layers each have a thickness between 10 μm and 60 μm.

5. The high frequency transmission cable of claim 4, wherein the shielding layer has a thickness between 5 μm and 25 μm.

6. The high frequency transmission cable of claim 1, further comprising a protective layer attached to the shielding layer by an adhesive layer.

7. The high frequency transmission cable of claim 1, which is configured for use in a frequency less than 20 GHZ.

8. The high frequency transmission cable of claim 1, further comprising two protective layers over two exterior surfaces of the shielding layer respectively.

9. The high frequency transmission cable of claim 8, wherein the protective layers each have a thickness between 5 μm and 200 μm.

* * * * *